(12) United States Patent
Schulze et al.

(10) Patent No.: US 8,592,903 B2
(45) Date of Patent: Nov. 26, 2013

(54) BIPOLAR SEMICONDUCTOR DEVICE AND MANUFACTURING METHOD

(75) Inventors: Hans-Joachim Schulze, Taufkirchen (DE); Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 373 days.

(21) Appl. No.: 12/324,374

(22) Filed: Nov. 26, 2008

(65) Prior Publication Data

US 2010/0127304 A1    May 27, 2010

(51) Int. Cl.
*H01L 29/78*    (2006.01)
(52) U.S. Cl.
USPC ............... 257/341; 257/493; 257/E27.019; 257/E29.066
(58) Field of Classification Search
USPC .......................................... 257/341
See application file for complete search history.

(56) References Cited

U.S. PATENT DOCUMENTS

| | | | |
|---|---|---|---|
| 5,063,428 A | 11/1991 | Schlangenotto et al. | |
| 5,619,047 A | 4/1997 | Bauer | |
| 5,851,857 A * | 12/1998 | Kelberlau et al. | 438/134 |
| 6,465,863 B1 * | 10/2002 | Deboy et al. | 257/495 |
| 6,803,627 B2 * | 10/2004 | Pfirsch | 257/341 |
| 7,301,220 B2 * | 11/2007 | Udrea | 257/556 |
| 2005/0161746 A1 * | 7/2005 | Mauder et al. | 257/370 |
| 2007/0029634 A1 | 2/2007 | Schulze et al. | |

FOREIGN PATENT DOCUMENTS

DE    4438896 A1    5/1996
DE    102004004862    8/2005

OTHER PUBLICATIONS

"Leistungselektronische Bauelemente", D. Schroeder, Technische Universitaet Muenchen, Springer.

* cited by examiner

*Primary Examiner* — Jerome Jackson, Jr.
(74) *Attorney, Agent, or Firm* — Dicke, Billig & Czaja, PLLC

(57) ABSTRACT

A bipolar semiconductor device and manufacturing method. One embodiment provides a diode structure including a structured emitter coupled to a first metallization is provided. The structured emitter includes a first weakly doped semiconductor region of a first conductivity type which forms a pn-load junction with a weakly doped second semiconductor region of the diode structure. The structured emitter includes at least a highly doped first semiconductor island of the first conductivity type which at least partially surrounds a highly doped second semiconductor island of the second conductivity type.

15 Claims, 13 Drawing Sheets

BIPOLAR SEMICONDUCTOR DEVICE AND MANUFACTURING METHOD

BACKGROUND

This specification refers to bipolar semiconductor devices including a diode structure, in particular to power semiconductor devices, and a manufacturing method therefor.

Diode structures are desired to have a very good surge current strength and also a sufficient dynamic robustness. Moreover, the losses occurring during operation are to be kept small. For this purpose, CAL diodes (CAL=Controlled Axial Lifetime) and EMCON diodes (EMCON=Emitter Controlled) have been developed. In the case of CAL diodes, a heavily doped p-type emitter is used, but the latter additionally requires intensive helium irradiation and further methods for reducing the charge carrier lifetime in order that the turn-off losses do not become too high. EMCON diodes, by contrast, have a relatively weakly p-doped emitter. However, a reduced surge current strength is observed in this case.

A further diode variant is the "speed diode" (self-adjusted p-emitter efficiency diode). While the forward current of this diode essentially flows via a weakly p-doped zone during normal operation, in the surge current case charge carriers are injected from highly p-doped zones and contribute to a high surge current strength and surge energy capacity, respectively. However, the dynamic robustness of the known speed diode is often unsatisfactory.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
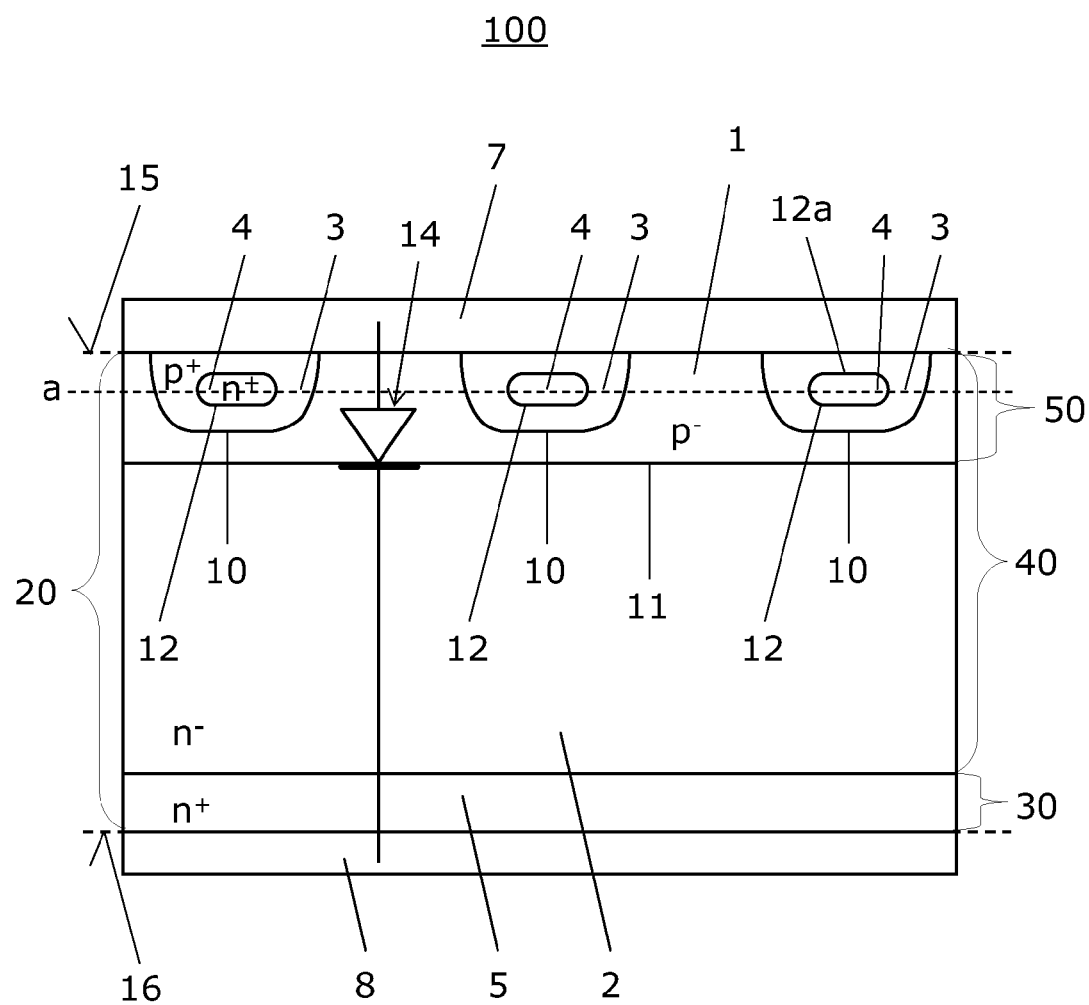
FIG. 1 illustrates a vertical cross-section of a semiconductor device according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The terms "lateral" and "horizontal" as used in this specification intends to describe an orientation parallel to a first surface of a semiconductor substrate or body. This can be for instance the surface of a wafer or a die.

The term "vertical" as used in this specification intends to describe an orientation which is arranged perpendicular to the first surface of the semiconductor substrate or body.

In this specification, p-doped is referred to as first conductivity type while n-doped is referred to as second conductivity type. The semiconductor devices can be formed with opposite doping relations so that the first conductivity type can be n-doped and the second conductivity type can be p-doped. Furthermore, some Figures illustrate relative doping concentrations by indicating "−" or "+" next to the doping type. For example, "n$^-$" means a doping concentration which is less than the doping concentration of an "n"-doping region while an "n+"-doping region has a larger doping concentration than the "n"-doping region. Indicating the relative doping concentration does not, however, mean that doping regions of the same relative doping concentration have to have the same absolute doping concentration unless otherwise stated. For example, two different n+ regions can have different absolute doping concentrations. The same applies, for example, to an n+ and a p+ region.

Specific embodiments described in this specification pertain to, without being limited thereto, bipolar power semiconductor devices including a diode structure having a load pn-junction which is forwardly biased when a forward current flows through the diode structure. The term "bipolar semiconductor device" as used in this specification intends to describe a semiconductor device in which the forward current is essentially a bipolar current flow. Examples of bipolar semiconductor devices include, without being limited thereto, diodes, thyristors and IGBTs.

According to one embodiment, a bipolar semiconductor device is provided. The semiconductor device includes a first metallization and a diode structure having a forward current flow direction. The diode structure includes a first semiconductor region of a first conductivity type which is electrically coupled with the first metallization, and a second semiconductor region of a second conductivity type which forms a first pn-junction with the first semiconductor region. When a forward current flows through the diode structure, the first pn-junction is forwardly biased. The diode structure further includes at least a third semiconductor region of the first conductivity type which is electrically coupled with the first metallization and forms an interface with the first semiconductor region, and at least a fourth semiconductor region of the second conductivity type which is at least partially embedded in the third semiconductor region such that at least one of the first semiconductor region and the third semiconductor region is arranged between the second semiconductor region and the fourth semiconductor region. The doping concentration of the third semiconductor region is higher than the doping concentration of the first semiconductor region, and the doping concentration of the fourth semiconductor region is higher than the doping concentration of the second semiconductor region. Further, the fourth semiconductor is arranged to inject charge carriers at least into the third semiconductor region during at least one of commutation and switching off of the forward current.

According to another embodiment, a method for manufacturing a bipolar semiconductor device including a first semiconductor region of a first conductivity type having a first doping concentration and a second semiconductor region of a second conductivity type having a second doping concentrations is provided. The first semiconductor region and the second semiconductor region form a first pn-junction. At least a third semiconductor region of the first conductivity type including a third doping concentration which is higher than the first doping concentration is formed such that the first semiconductor region and the third semiconductor region form an interface. At least a fourth semiconductor region of the second conductivity type having a fourth doping concentration which is higher than the second doping concentration is formed such that the fourth semiconductor region is spaced apart from the second semiconductor region and at least partially embedded in the third semiconductor region with which the fourth semiconductor region forms a second pn-junction. The fourth semiconductor region is arranged to inject charge carriers at least into the third semiconductor region during at least one of commutation and switching off of a forward current. A first metallization is formed such that the first metallization is in Ohmic contact with the first semiconductor region and such that the first semiconductor region is arranged between the first metallization and the second semiconductor region.

FIG. 1 illustrates one embodiment of a semiconductor device 100 which is typically a power semiconductor device in a vertical cross-section. The semiconductor device 100 includes a semiconductor substrate 20 having a first surface 15 and a second surface 16 arranged opposite to the first surface 15. The semiconductor substrate 20 can be made of any semiconductor material suitable for manufacturing a semiconductor device. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon-silicon carbide ($Si_xC_{1-x}$) and SiGe heterojunction semiconductor material. For power semiconductor applications currently mainly Si, SiC and GaN materials are used.

The semiconductor substrate 20 can be a single bulk mono-crystalline material. It is also possible, that the semiconductor substrate 20 includes a bulk mono-crystalline material 30 and at least one epitaxial layer 40 formed thereon. Using epitaxial layers 40 provides more freedom in tailoring the background doping of the material since the doping concentration can be adjusted during deposition of the epitaxial layer or layers.

Typically, the semiconductor substrate 20 is formed by providing a single bulk mono-crystalline body 30 of a second conductivity type (n-type) on which one or more single-crystalline layers 40 are deposited epitaxially. The body 30 may form a highly doped n-type fifth semiconductor region 5. The epitaxial layer or layers 40 accommodates or accommodate a p-type first semiconductor region 1, an n-type second semiconductor region 2, p-type third semiconductor regions 3 and n-type fourth semiconductor regions 4. During epitaxial deposition, the desired doping concentration of the first and second semiconductor region 1 and 2 can be adjusted by supplying an appropriate amount of dopant. Different thereto, the third and fourth semiconductor regions 3 and 4 are typically formed in the epitaxially deposited semiconductor regions 1 and 2 by implantation. It would also be possible to form the first semiconductor region 1 by implantation. If desired, the manufacturing can include separate epitaxial deposition processes with different dopants of varying concentration or with the same dopant but with varying concentration to form the respective functional regions.

In one or more embodiments, a substrate wafer or die having the desired background doping concentration of the second semiconductor region 2 is provided. The first, third and fourth semiconductor regions 1, 3 and 4 are formed by implantation at the first surface 15. This may be followed by a high temperature process. If desired, the substrate wafer can be thinned at the second surface 16 and the fifth semiconductor region 5 is formed by implantation at the second surface 16 which may be followed by a high temperature process. It would also be possible to thin the substrate wafer before implanting the fifth semiconductor region 5, if such thinned wafers can reasonably be handled. By using this approach, an expensive epitaxial deposition is avoided.

The semiconductor device 100 of FIG. 1 further includes a first metallization 7 which forms an anode 7 in an embodiment and is arranged on, and in Ohmic contact with, the first semiconductor region 1 for electrical connecting the first semiconductor region 1. The second semiconductor region 2 is spaced apart from the first metallization 7 and forms a first pn-junction 11 with the first semiconductor region 1 so that any current flowing through the semiconductor device between the anode 7 and the second semiconductor region 2 has to flow across the first pn-junction 11. Within the first semiconductor region 1 several spaced apart p-type third semiconductor regions 3 or first islands 3 which are also adjoining the first metallization 7 are arranged. Interfaces 10 are formed between the first semiconductor region 1 and each of the third semiconductor regions 3 having a different doping concentration than the first semiconductor region 1. The term "interface" as used in this specification intends to describe the boundary surface or boundary layer between adjoining semiconductor regions or portions of the same conductivity type but having significantly different doping concentrations. The term "junction" as used in this specification intends to describe the boundary surface or boundary layer between adjoining semiconductor regions of different conductivity type.

In one embodiment, the p-type third semiconductor regions 3 have a higher doping concentration than the first semiconductor region 1 as indicated by the symbols "p+" and "p−". According to one embodiment, each of the third semiconductor regions 3 completely surrounds an n-type fourth semiconductor region 4 or second islands 4 with which respective second pn-junctions 12 are formed. The n-type fourth semiconductor regions 4 may have a higher doping concentration than the n-type second semiconductor region 2 as indicated by the symbols "n+" and "n−". Further, the fifth n-type semiconductor region 5 may adjoin the second semiconductor region 2 and forms an Ohmic contact to a second metallization 8 which forms a cathode in this embodiment and is arranged on the second surface 16. The material of the anode 7 and cathode 8 may be a metal such as Al, Ti, W and Cu but may also be a material with metallic or near metallic properties with respect to electric conductivity such as highly doped n-type or p-type poly-Si, TiN or an electrically conductive silicide such as $WSi_2$. In the context of the present specification, the terms "in Ohmic contact", "in electric contact", "in contact" and "electrically coupled" intend to describe that there is an Ohmic electric connection or Ohmic current path between two regions, portion or parts of a semiconductor devices, in one embodiment a connection of low Ohmic resistance, even if no voltages are applied to the semiconductor device. An Ohmic electric connection is characterized by a linear and symmetric current-voltage (I-V) curve.

To realize a low resistance Ohmic contact, the doping concentration of the fifth semiconductor region 5 may be higher than the doping concentration of the second semiconductor region 2. Typical doping concentrations range between about $10^{15}$ cm$^{-3}$ to about $10^{17}$ cm$^{-3}$ for the first (p−) semiconductor region 1, between about $10^{16}$ cm$^{-3}$ to about $10^{19}$ cm$^{-3}$ for the third (p+) semiconductor region 3, between about $10^{12}$ cm$^{-3}$ to about $10^{14}$ cm$^{-3}$ for the second (n−) semiconductor region 2, and between about $10^{17}$ cm$^{-3}$ to about $10^{20}$ cm$^{-3}$ for the third and fifth (n+) semiconductor regions 3 and 5, respectively.

With these doping concentrations, the semiconductor device 100 can be operated as a diode 14 with the first metallization 7 as anode 7, the second metallization 8 as cathode 8, the fifth semiconductor region 5 as cathode emitter region 5, the second semiconductor region 2 as n-basis region 2, the first pn-junction 11 as rectifying pn-load junction 11 and the first semiconductor region 1 including the third and fourth semiconductor regions 3 and 4 as a structured anode emitter 50. Thus, the semiconductor device 100 as described herein may form a speed diode with a structured anode emitter 50 including the additional fourth semiconductor regions 4. Owing to the fourth semiconductor regions 4, the semiconductor device 100 and diode 14, respectively, has, a high reverse voltage capability, a high surge current strength and a low forward voltage drop as conventional speed diodes, and further improved reverse recovery characteristics. In other words, the semiconductor device 100 may form a speed-diode 14 with improved dynamic robustness during switching off and/or commutating. During normal operation, a forward current flows from the anode 7 to the cathode 8 as indicated by the diode symbol 14. The forward current of the speed diode 100 of FIG. 1 flows via the typically weakly p-doped first semiconductor region 1. In the event of a surge current during normal operation, charge carriers (holes) are injected from the typically heavily p-doped third semiconductor regions into the first semiconductor region 1 resulting in a high surge current strength. In the event of switching off and/or commutating the current from the forward direction to the reverse current direction, the typically heavily doped fourth semiconductor regions 4 inject electrons into the third semiconductor region 3 at high enough hole current densities. Significant injection of electrons into the third semiconductor region 3 starts when the second pn-junction 12 in the region next to or closest to the anode 7 is driven into the avalanche breakdown. Depending on doping concentrations, geometry and arrangement of the semiconductor regions this avalanche breakdown occurs above a threshold for the hole current density during switching off and/or commutating. For example, the hole current density threshold of the onset of the avalanche breakdown can be adjusted by the vertical and lateral extension of the fourth semiconductor. Due to the injection of electrons from the fourth semiconductor region 4, the charge density originating from the hole current in the first and third semiconductor region 1 and 3 is at least partially compensated which reduces the electric field strength, in one embodiment close to the interface 10, and hence the risk of an avalanche breakdown of the device 100. Consequently, the dynamic robustness during switching off and/or commutating is improved. The term "commutating" as used in this specification intends to describe the switching of the current of a bipolar semiconductor device from the forward direction or conducting direction in which the pn-load junction is forwardly biased to the opposite direction or reverse direction in which the pn-load junction is reversely biased.

Further, the structured anode emitter 50 as described herein can also replace anode emitters in other bipolar semiconductor devices such as thyristors to improve their dynamic robustness during switching off and/or commutating.

A structured cathode emitter having the same or a similar geometry as the structured anode emitter 50 but reversed doping types can be used alternatively and/or in addition in bipolar semiconductor devices.

Furthermore, structured anode and/or cathode emitters as described herein can be used in vertical bipolar semiconductor devices as illustrated in FIG. 1 as well as in planar bipolar semiconductor devices in which the anode and cathode are arranged on the same surface of the semiconductor body.

Figure 2:
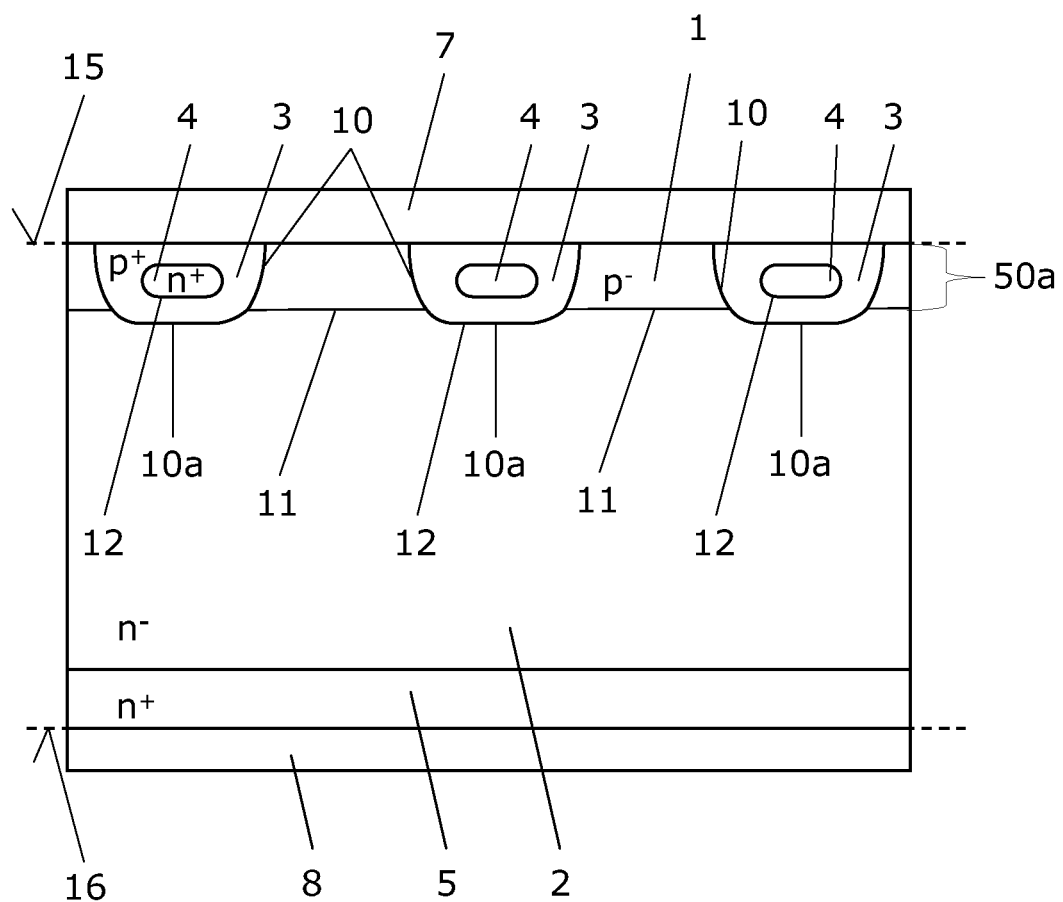
FIG. 2 illustrates a vertical cross-section of a semiconductor device according to one embodiment.

The semiconductor device 100 illustrated in FIG. 2 is similar to the semiconductor device 100 of FIG. 1. However, the second and third semiconductor regions 2 and 3 adjoin each other in FIG. 2, whereas the second and third semiconductor regions 2 and 3 are spaced apart from each other, i.e. completely separated by portions of the first semiconductor region 1, in FIG. 1. In other words, the second semiconductor region 2 and the third semiconductor region 3 in FIG. 2 form a third pn-junction 10a in their boundary region. Since the third pn-junction 10a and the first pn-junction 11 adjoin each other, i.e. form a common pn-load-junction, the structured emitter region 50a including the first, third and fourth semiconductor regions 1, 3 and 4, and designed as illustrated in FIG. 2, has similar properties as explained with respect to the structured emitter region 50 of FIG. 1. Accordingly, the semiconductor device 100 of FIG. 2 may also form a speed-diode with improved dynamic robustness during switching off and/ or commutating.

Figure 3:
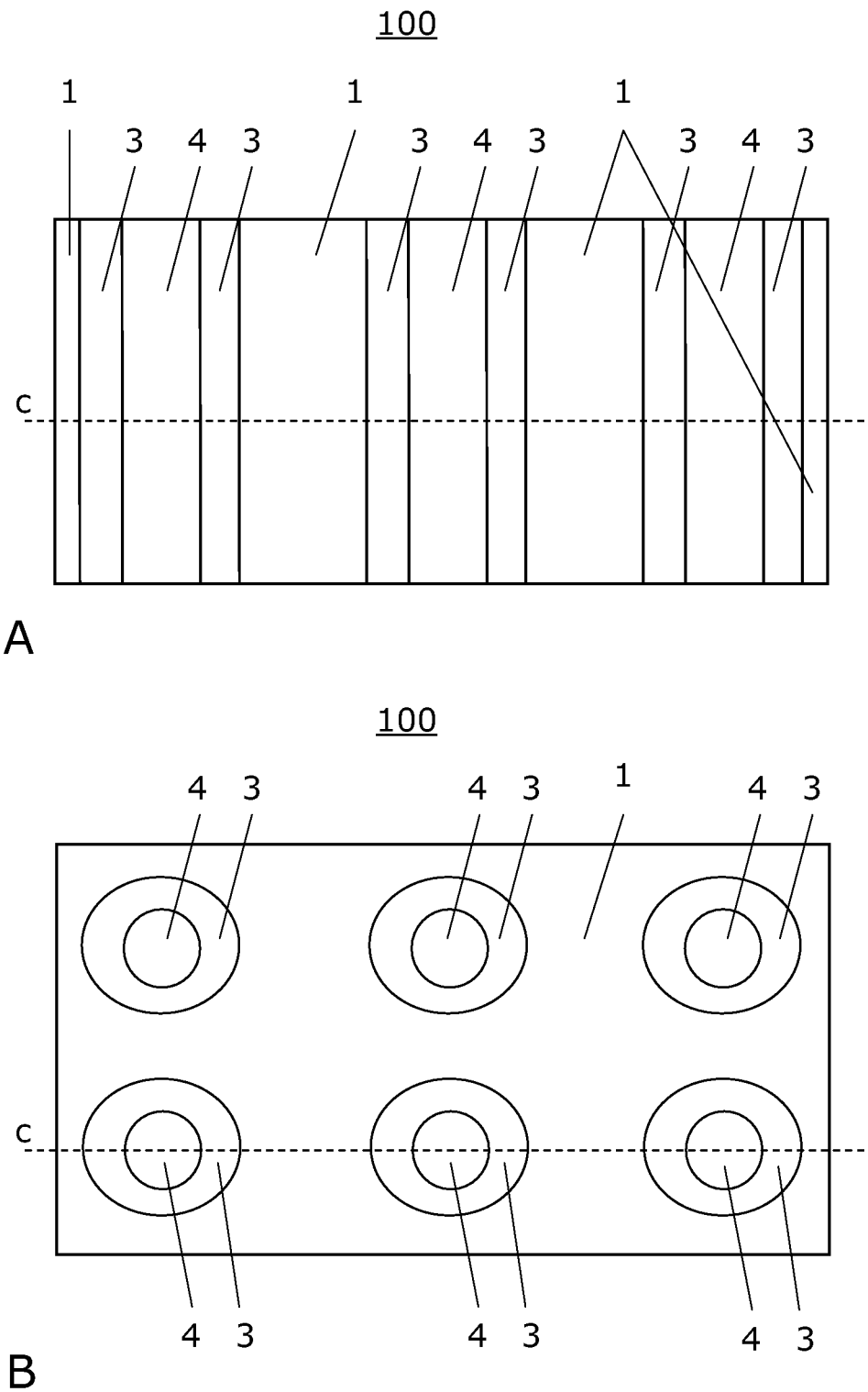
FIGS. 3A and 3B illustrate several embodiments of semiconductor devices in horizontal cross-sections.

In certain embodiments, the semiconductor device 100 is a vertical power device. This is illustrated in FIGS. 3A and 3B illustrating horizontal cross-sections through the structured anode emitter 50 of the semiconductor devices 100 of FIG. 1 along the dashed line a. A vertical cross-section along the dashed lines c in FIGS. 3A and 3B, respectively, typically corresponds to a vertical cross-section as illustrated in FIG. 1. The structured anode emitter 50 includes a plurality of spaced apart third semiconductor regions 3 each of which surrounds one fourth semiconductor region 4. The third semiconductor regions 3 are typically formed as wells which extend along a horizontal direction as illustrated in FIG. 3A or completely enclose a respective fourth semiconductor region 4 in the horizontal cross-section as illustrated in FIG. 3B. The third semiconductor regions 3 of FIG. 3B are arranged on a square lattice and have a circular boundary to the first semiconductor region 1. The boundary between the first and the third semiconductor region may, however have any shape including polygons with optionally smoothed edges. Further, the third semiconductor regions may also be arranged on a different regular lattice, e.g., in a hexagonal arrangement. In the embodiment of FIG. 3A, the fourth semiconductor regions 4 are shaped as bars extending into the same direction as the third semiconductor regions 3. The fourth semiconductor regions in FIG. 3B have a circular shape. The boundary between the third and the fourth semiconductor region may, however, have also any shape including polygons with optionally smoothed edges.

Figure 4:
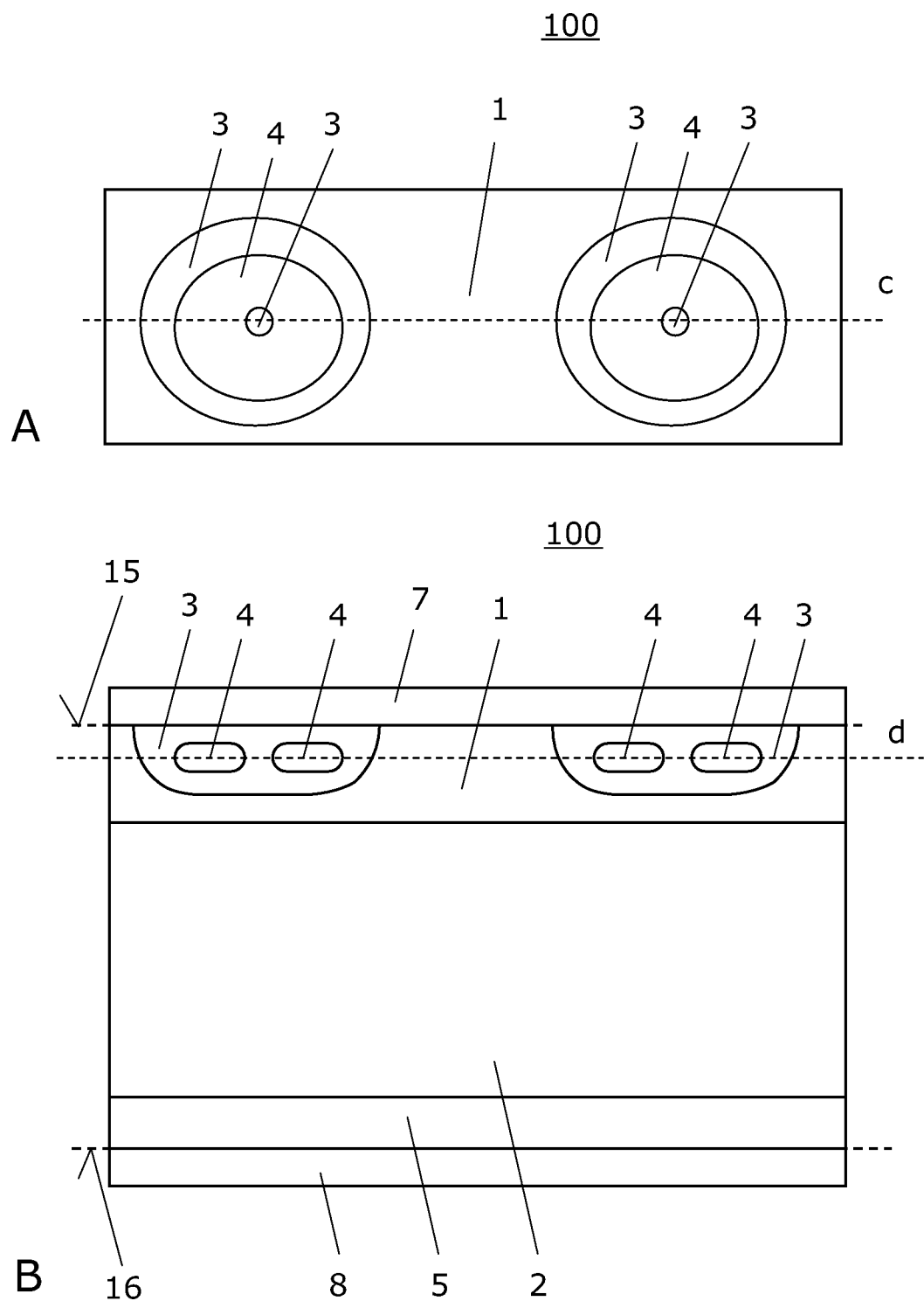
FIGS. 4A and 4B illustrate a horizontal and a vertical cross-section, respectively, of a semiconductor device according to one or more embodiments.

According to one embodiment the fourth semiconductor region 4 is shaped as a ring or torus which is completely surrounded by the third semiconductor region 3 as explained with respect to FIG. 4. FIG. 4A illustrates a horizontal cross-section along the line d in FIG. 4B and FIG. 4B illustrates a vertical cross-section along the line c in FIG. 4A. Again, the third semiconductor regions 3 are typically arranged on a regular lateral two-dimensional lattice. In another embodiment, the semiconductor regions of FIG. 4B extend into the semiconductor body in the normal direction of the illustrated cross-section, i.e. the third semiconductor region 3 and the fourth semiconductor regions 4 extends as wells and bars, respectively, into a horizontal direction. Each third semiconductor region 3 completely encloses or surrounds, at least in a vertical cross-section, two spaced apart fourth semiconductor regions 4. In such an embodiment, the injection of charge carriers during the occurrence of a surge current in forward direction is improved compared to one, at least in a vertical cross-section, simply coupled fourth semiconductor region 4 enclosed by a third semiconductor region 3.

In one embodiment, the two fourth semiconductor regions 4 adjoining a common third semiconductor region 3 are, at least in a vertical cross-section, equally shaped and equally arranged with respect to the interface 10 of mirror-symmetrical third semiconductor regions 3. The reason for this is to particularly protect regions against an avalanche-breakdown that are at higher risk during shutting off and/or commutation. This is explained in more detail with respect to FIG. 5

Figure 5:
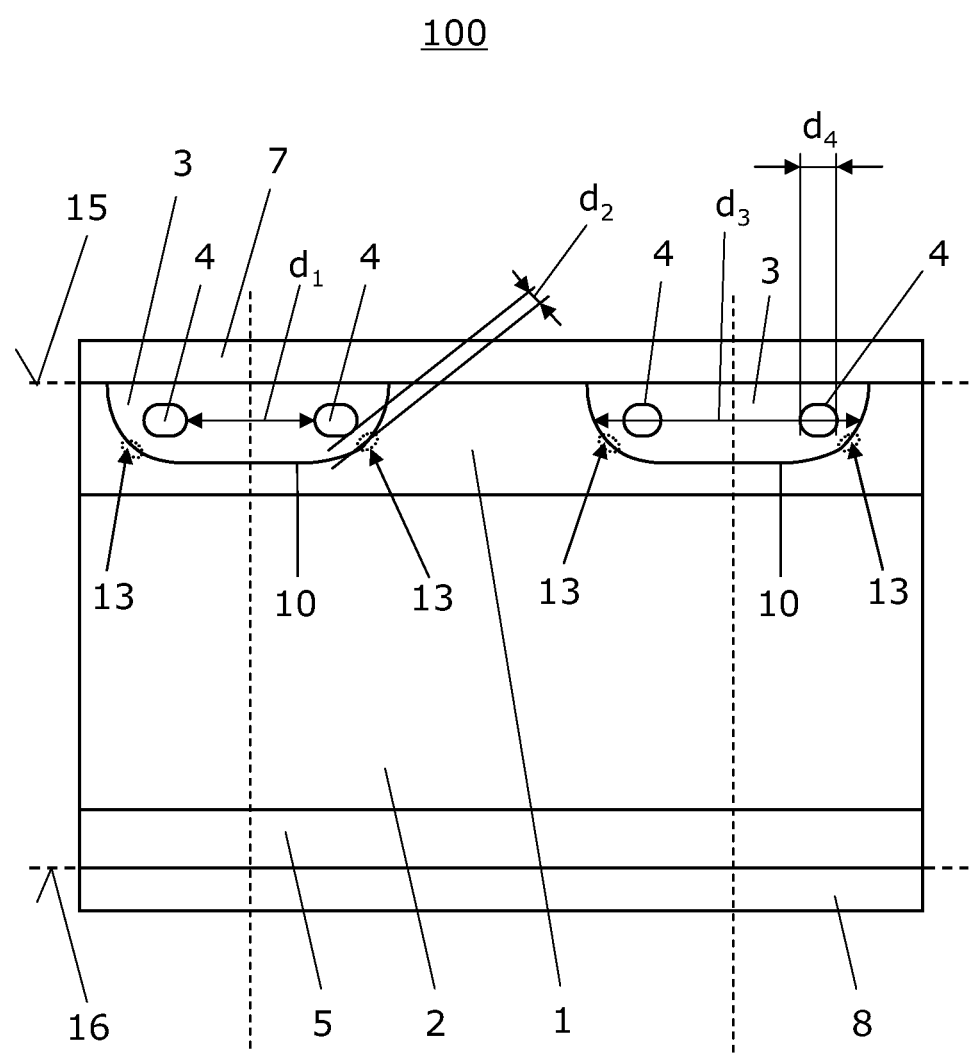
FIG. 5 illustrates a vertical cross-section of a semiconductor device according to one embodiment.

FIG. 5 illustrates in a vertical cross-section a semiconductor device 100 according to several embodiments. As in FIG. 4, two equally shaped fourth semiconductor regions 4 are illustrated in a mirror-symmetrical way within the mirror-symmetrical third semiconductor regions 3 in the vertical cross-section. The fourth semiconductor regions 4 can, however, be part of common ring-shaped semiconductor region 4 as illustrated in FIG. 4A, or bar-shaped semiconductor regions running parallel to each other as in FIG. 3A. The respective vertical mirror axes are plotted as dashed lines. In the event of shutting off and/or commutation, highest electric field strength is typically to be expected in portions 13 close to parts of the interface 10 where the curvature of the interface 10 is higher. Due to symmetry, the portions 13 are also mirror-symmetrically arranged. To protect the portions 13, the fourth semiconductor 4 is typically arranged close to each portion 13. In doing so, electrons are preferably injected into regions where they are most effective in reducing the electric field strength.

In one embodiment, the lateral distance $d_1$ between two fourth semiconductor regions 4 enclosed by one third semiconductor region 3 is larger than the minimal lateral distance and/or the minimum total distance $d_2$ between a fourth semiconductor region 4 and the first semiconductor region 1. Further, the third semiconductor regions 3 have a third lateral extension $d_3$ in the plane in which the fourth semiconductor regions 4 have their maximum extension $d_4$. The maximum extension $d_4$ is typically smaller than a quarter of the third lateral extension $d_3$. In doing so, the robustness during switching off and/or commutating of the semiconductor device 100 can be efficiently increased compared to known speed diodes without significantly altering the surge current strength.

Figure 6:
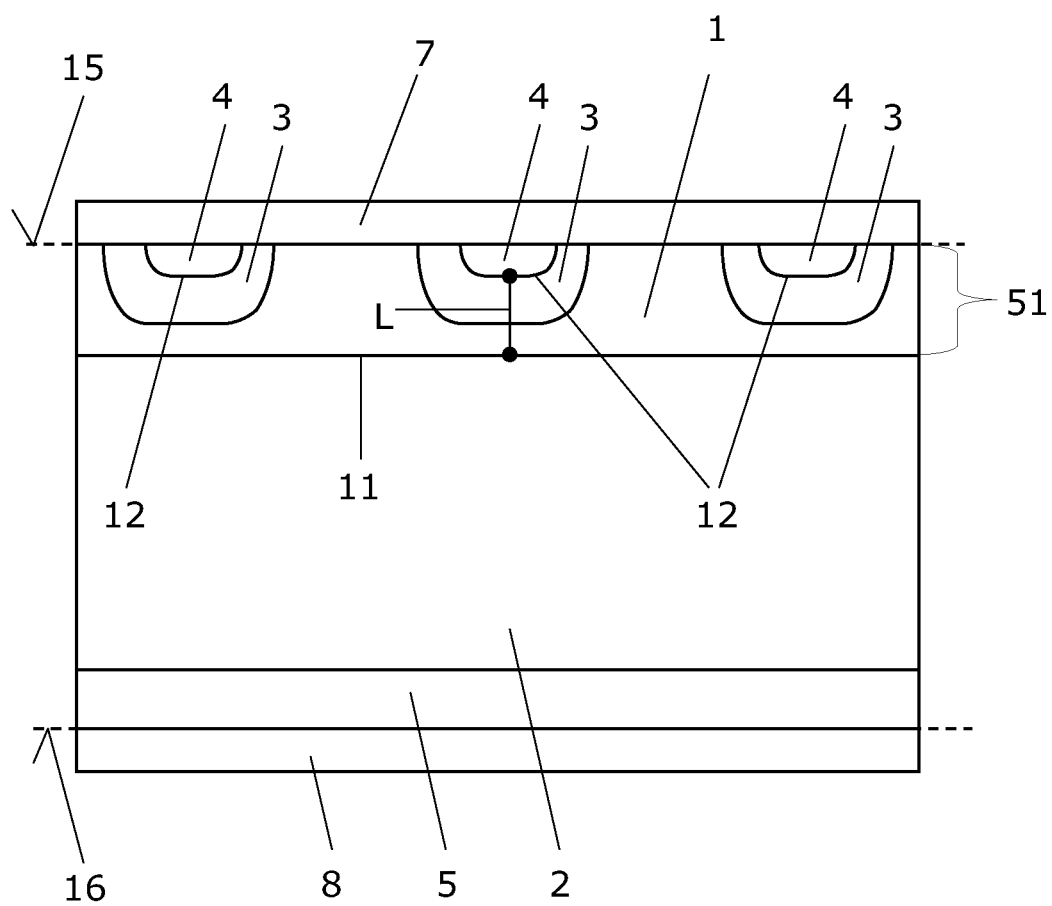
FIG. 6 illustrates a vertical cross-section of a semiconductor device according one or more embodiments.

FIG. 6 illustrates a vertical cross-section of a semiconductor device 100 according to another embodiment which is similar to the one illustrated in FIG. 1. However, in the embodiment illustrated in FIG. 6, the fourth semiconductor regions 4 are not completely surrounded by a respective third semiconductor region 3 on all sides, but partially embedded in the respective third semiconductor region 3 and adjoining the anode 7. In other words, the fourth semiconductor regions 4 are electrically coupled to the anode 7 and adjoining a respective third semiconductor region 3. Further, the fourth semiconductor region 4 adjoins only the anode 7 and the third semiconductor region 3 in this embodiment. This arrangement of the anode 7 and a structured anode emitter 51 including fourth semiconductor regions 4 extending from the anode into the third semiconductor region 3, results in a similar improvement of the robustness during off and/or commutating as can be achieved with the above discussed structured anode emitter 50. In the event of a structured anode emitter 51 having fourth semiconductor regions 4 which are coupled to the anode 7, an electron current is injected from the fourth semiconductor regions 4 into the third semiconductor regions 3 when the maximum voltage drop between the fourth semiconductor regions 4 and the third semiconductor regions 3 exceeds the built-in voltage of the semiconductor material, which amounts e.g., for Si to about 0.7 V.

The line integrated doping concentration along a shortest connection line L between the first pn-junction 11 and the second pn-junction 12 is typically larger than the specific breakdown charge per unit area of the semiconductor material. Note, that the illustrated connection line L lies on a not illustrated vertical mirror axis of the respective third and fourth semiconductor region 3 and 4, and hence corresponds to a part of an electric field line if a voltage is applied between the anode 7 and the cathode 8.

Again, a similar cathode emitter can be realized with opposite doping types. In this embodiment, the fourth semiconductor regions 4 are typically arranged to inject holes into the third semiconductor regions 3 during shutting off and/or commutation.

In another embodiment, two equally shaped fourth semiconductor regions 4 adjoin each third semiconductor region 3 of the structured emitter 51. In doing so, the robustness during switching off and/or commutating of the semiconductor device 100 can again be efficiently increased compared to known speed diodes without significantly altering the surge current strength.

Figure 7:
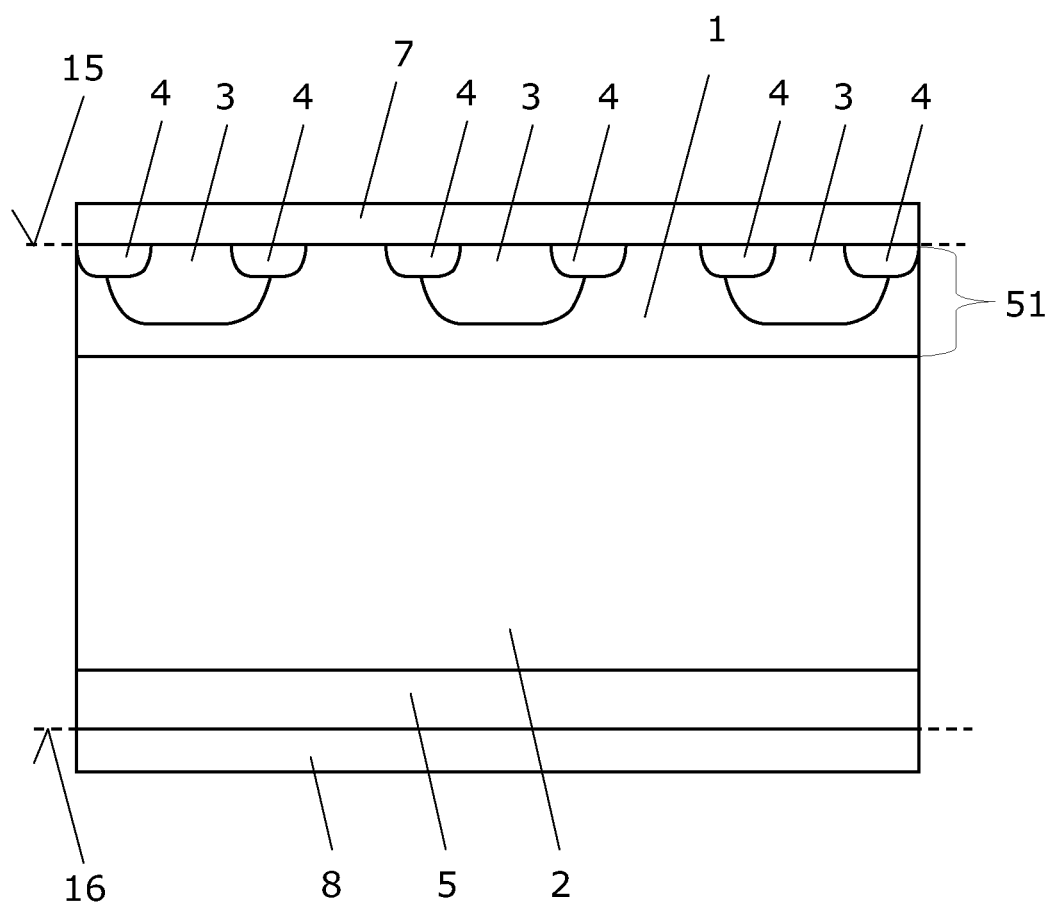
FIG. 7 illustrates a vertical cross-section of a semiconductor device according one embodiment.

Furthermore, the two fourth semiconductor regions 4 adjoining each third semiconductor region 3 can laterally protrude the respective third semiconductor region 3 as illustrated in FIG. 7. The fourth semiconductor regions 4 are completely surrounded by the adjoining anode 7 and the p-doped first and third semiconductor regions 1 and 3. Further, the fourth semiconductor region 4 adjoins only the anode 7 and the first and third semiconductor region 1 and 3 in this embodiment. During switching off and/or commutating the fourth semiconductor regions 4 inject, if the maximum voltage drop between the fourth semiconductor regions 4 and the third semiconductor regions 3 exceeds the built-in voltage, electrons into first and third semiconductor region 1 and 3. This is a particularly efficient way to compensate the reverse hole current.

The third semiconductor regions 3 can be formed as wells and the fourth semiconductor regions 4 can be formed as wells or rings. For example, the third and fourth semiconductor regions 3 and 4 are formed as wells extending into a horizontal direction pointing out of the illustrated vertical cross-section. Further, the third semiconductor regions 3 are typically arranged on a regular one- or two-dimensional lattice.

Figure 8:
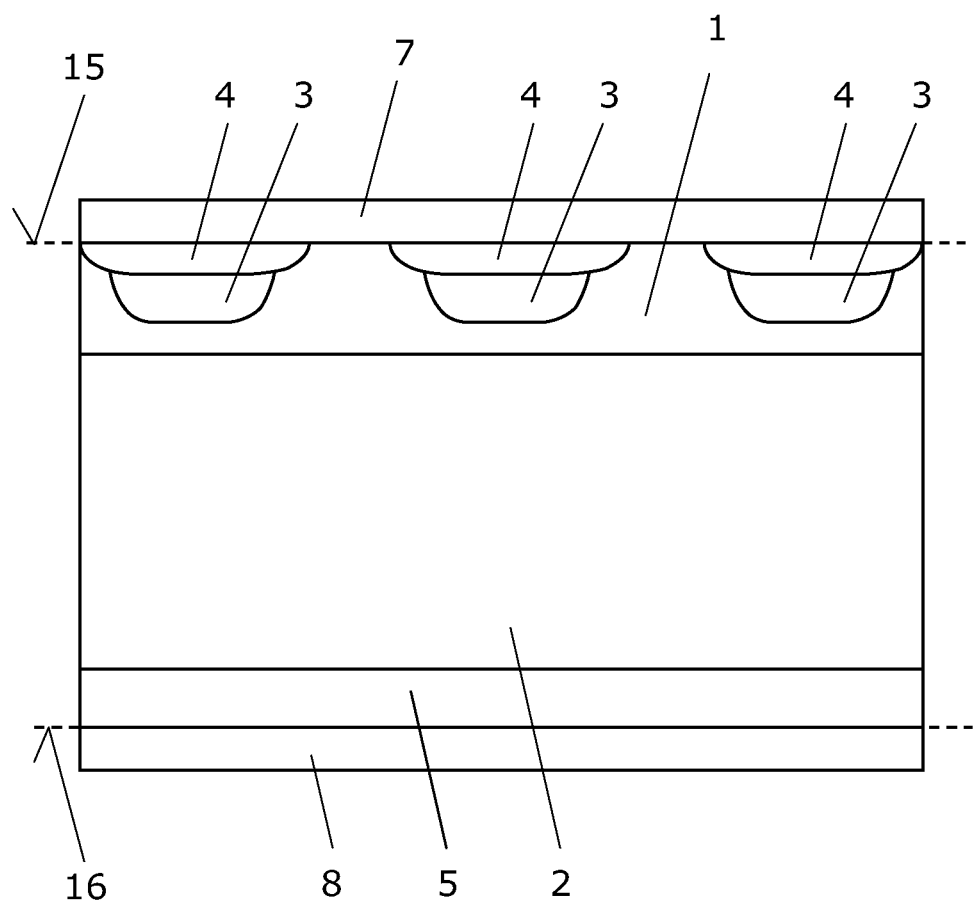
FIG. 8 illustrates another vertical cross-section of a semiconductor device as illustrated in FIG. 7 according to one embodiment.

In another embodiment, the third semiconductor regions 3 are electrically coupled to the anode 7 only in a portion of the semiconductor device 100. In other words, there are vertical cross-sections through the semiconductor device 100 of FIG. 7 in which the third semiconductor regions 3 do not adjoin the anode 7 as illustrated in FIG. 8.

Figure 9:
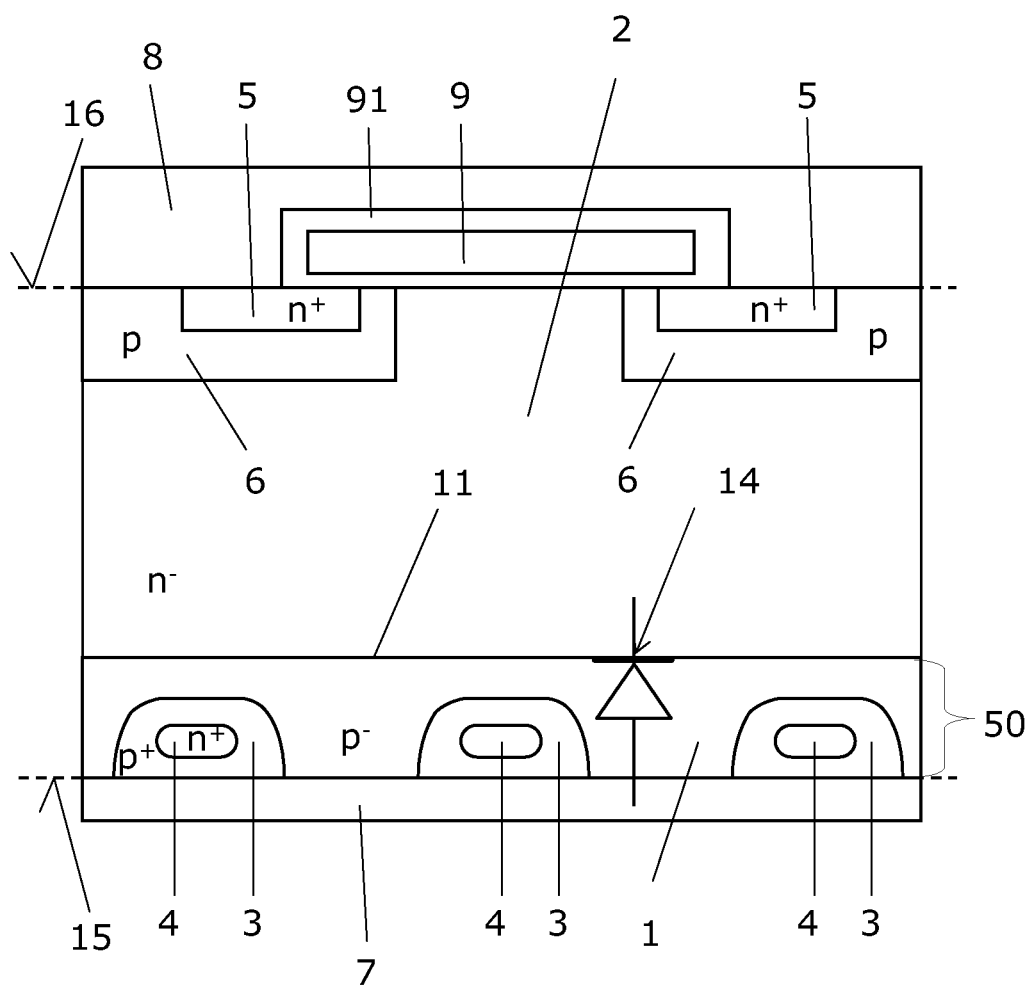
FIG. 9 illustrates a vertical cross-section of a semiconductor device according to one embodiment.

As has already been explained above, the improved emitter 50 and 51 can be used in other bipolar semiconductor devices too. Another example is given in FIG. 9 illustrating a vertical cross-section through an IGBT (Insulated Gate Bipolar Transistor) having an improved emitter 50. In this embodiment, the first metallization 7, the second metallization 8 and the second semiconductor region 2 refer to a collector electrode 7, a source electrode 8 and a drift region 2, respectively. In addition, an n-type fifth semiconductor region 5 forming a source region 5 and a p-type sixth semiconductor region 6 forming a body region 6 are typically coupled to the source electrode 8. Further pn-junctions are formed between the body region 6 and the source region 5 as well as between the second semiconductor region 2 and the sixth semiconductor region 6. Furthermore, a channel can be formed in forward mode, in which the load-junction 11 is forwardly biased, by applying an appropriate voltage to a gate electrode 9 insulated by a dielectric layer 91 and arranged next to a channel forming region of the body region 6. Since the structured emitter 50 and 51, which can both be used in IGBTs, includes fourth semiconductor regions 4 which are arranged to inject electrons at least partially into adjoining third semiconductor regions 3, the dynamic robustness during switching off and/or commutating of such an IGBT is improved.

The above described embodiment have in common that the diode structure includes a structured emitter having a first semiconductor region 1 of a first conductivity type which is electrically coupled to a first metallization 7, at least a third semiconductor region 3 or first semiconductor island 3 of the first conductivity type electrically coupled with the first metallization 7 and forming an interface 10 with the first semiconductor region 1, and at least a fourth semiconductor region 4 or second semiconductor island 4 of the second conductivity type and forming a second pn-junction with the third semiconductor region 3. Typically, the fourth semiconductor region 4 is at least partially embedded in the third semiconductor region 3 and is arranged to inject charge carriers at least into the third semiconductor region 3 during at least one of commutation and switching off of the forward current. Further, the diode structure includes a second semiconductor region 2 of the second conductivity type which forms a first pn-junction or pn-load junction with at least the first semiconductor region 1. The doping concentration of the third semiconductor region 3 is typically higher than the doping concentration of the first semiconductor region 1, and the doping concentration of the fourth semiconductor region 4 is typically higher than the doping concentration of the second semiconductor region 2. Typically, the third and fourth semiconductor regions 3 and 4 are highly doped semiconductor regions, whereas the first and second semiconductor regions 1 and 2 are weakly doped semiconductor regions. Furthermore, the diode structure is typically a speed diode structure and includes a plurality of fourth semiconductor regions 4 each of which adjoins a respective third semiconductor region 3.

Figure 10:
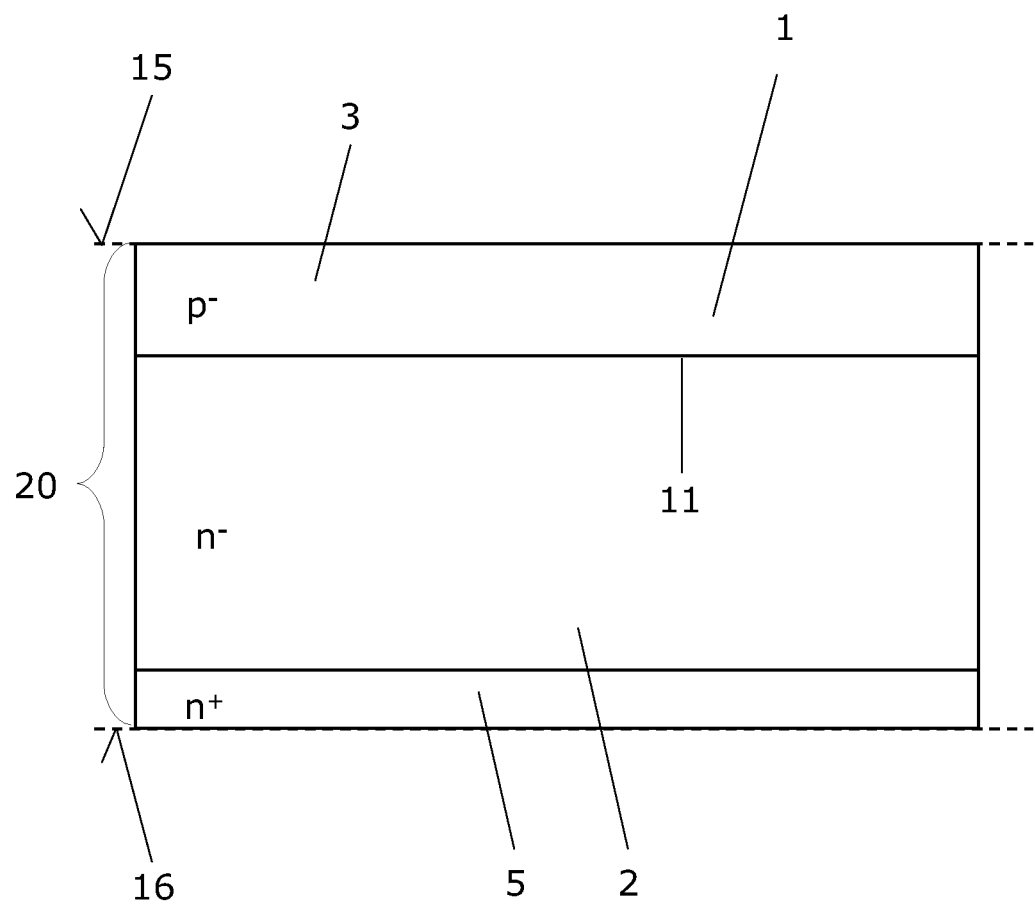
FIGS. 10-13 illustrate manufacturing processes according to one or more embodiments.
Figure 11:
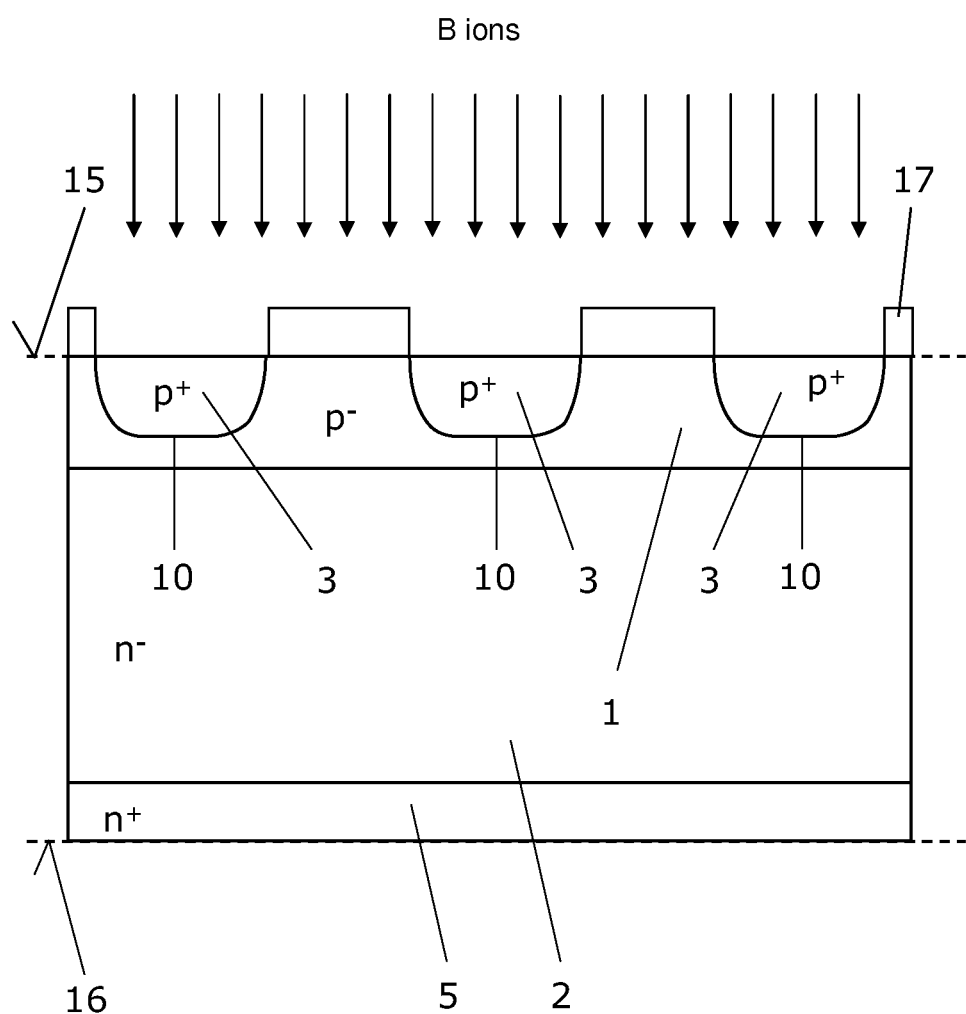
Figure 12:
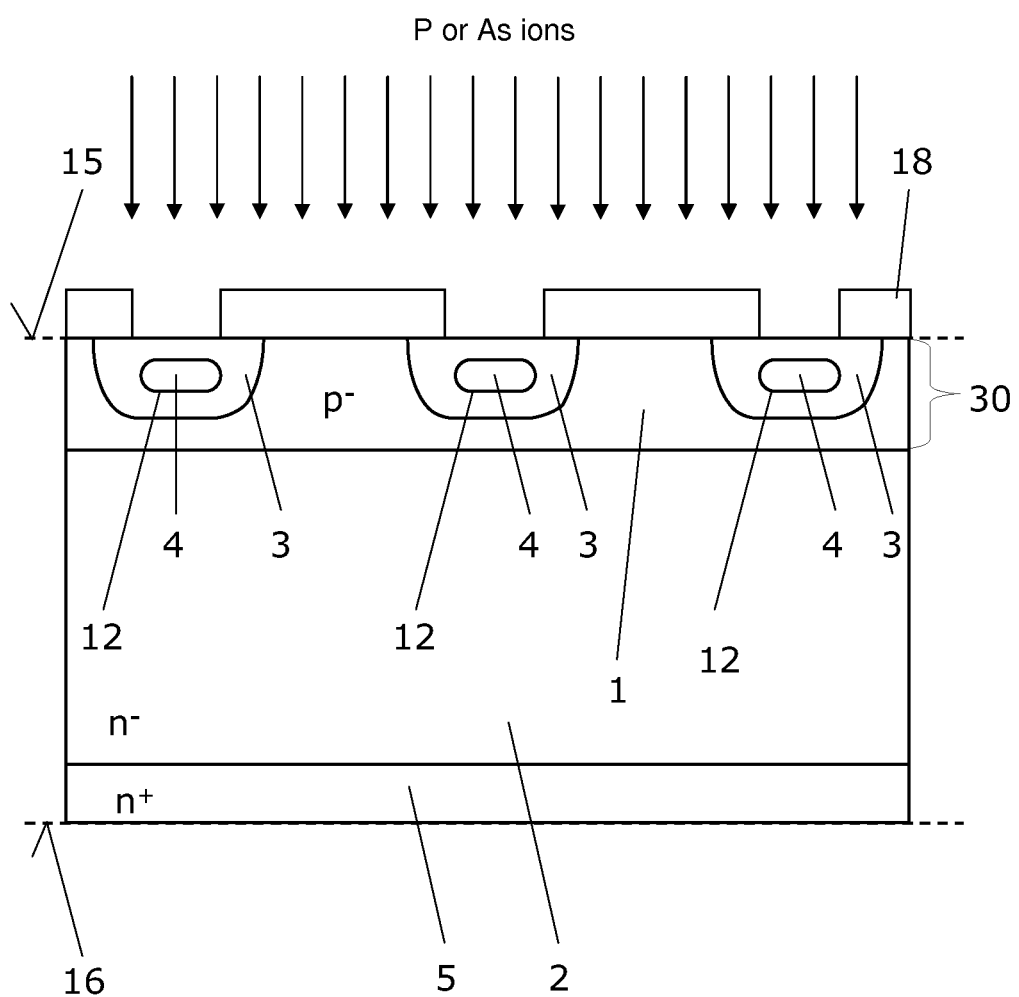
Figure 13:
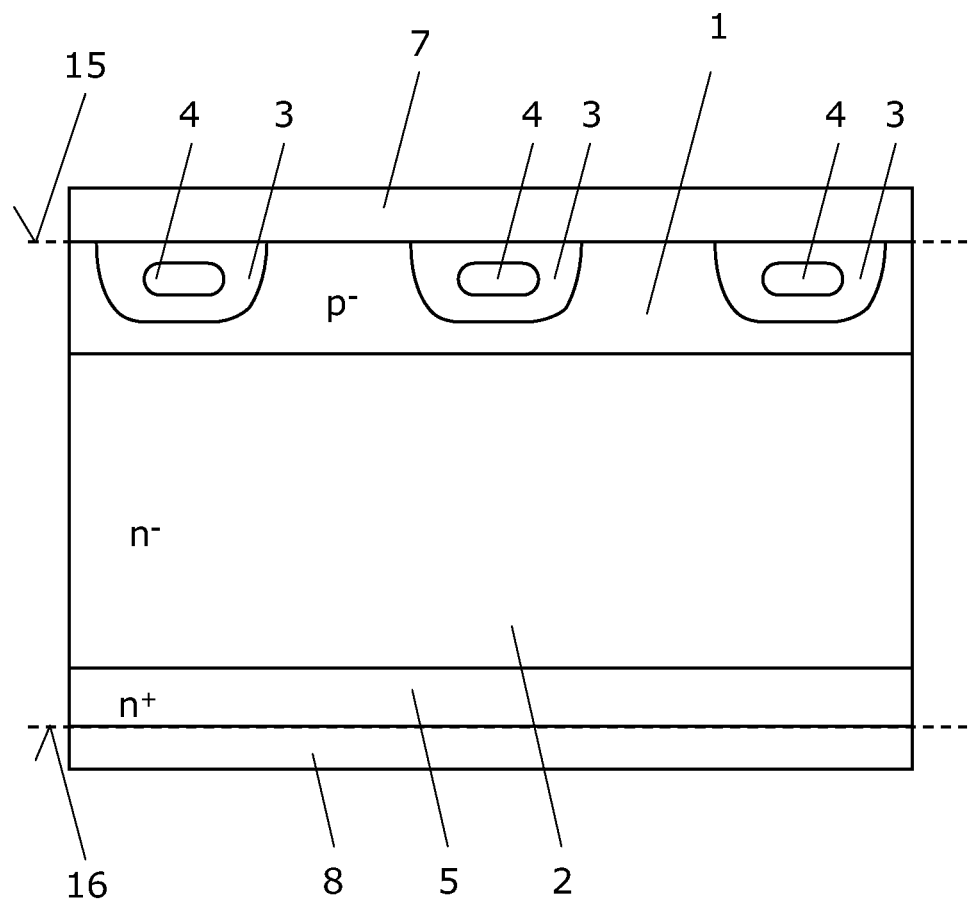

With respect to FIGS. 10-13 manufacturing processes according to one or more embodiments are illustrated. FIG. 10 illustrates a semiconductor device 100 after providing a semiconductor substrate 20 which includes a weakly doped p-type first semiconductor region 1 and a weakly doped n-type second semiconductor region 2. The first semiconductor region 1 and the second semiconductor region 2 form a first pn-junction 11. Typically, the semiconductor substrate 20 already includes a highly doped n-type fifth semiconductor region 5 which adjoins the second semiconductor region 2. In a subsequent step, a structured mask 17 is typically arranged on the first surface 15 of the semiconductor substrate 20 and several highly doped third semiconductor region 3 are formed, e.g., by ion implanting with boron ions and a subsequent high-temperature process, such that the first semiconductor region 1 and the third semiconductor region form an interface 10. This is illustrated in FIG. 11. The temperature to activate and/or in-diffuse the implanted dopants may be in a range of about 350° C. to about 1250° C. The duration of this high temperature process typically ranges between about a few seconds to about a few hours. FIG. 12 illustrates the semiconductor device 100 after the mask 17 was removed and a second structured mask 18 was arranged on the first surface 15 of the semiconductor substrate. Thereafter, several heavily doped n-type fourth semiconductor regions 4 are formed, e.g., by implantation of phosphorus (P) or arsenic (As) ions and a subsequent high-temperature process of about 350° C. to about 1250° C. typically lasting a few seconds up to a few hours, such that the fourth semiconductor regions 4 are spaced apart from the second semiconductor region 2 and at least partially or completely embedded in a respective third semiconductor region 3 with which the fourth semiconductor region 4 forms a second pn-junction 12. Each fourth semiconductor regions 4 may be completely surrounded by a respective third semiconductor region 3 or may extend to the first surface 15 for later electrical connecting to a first metallization. Further, the fourth semiconductor regions 4 are arranged to inject charge carriers at least into the adjoining third semiconductor region 3 during at least one of commutation and switching off of a forward current. Thereafter, a first metallization 7 is formed on the semiconductor substrate, such that the first metallization 7 is in Ohmic contact with the first semiconductor region 1 and such that the first semiconductor region 1 is arranged between the first metallization 7 and the second semiconductor region 2.

In one embodiment, the fourth semiconductor regions 4 are formed as well shaped semiconductor regions by ion implanting using an ion energy ranging between about 500 keV and about 1.5 MeV.

In a further embodiment, the process of forming fourth semiconductor regions 4 is typically followed by a process of rapid thermal annealing in a temperature range of about 850° C. to about 1000° C. for about 30 s up to about 2 h.

In one embodiment, a further process of forming a second metallization 8 on the second surface 16 of the semiconductor device 100 is performed which results in a semiconductor device 100 as illustrated in FIG. 1.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A bipolar semiconductor device, comprising:
a first metallization; and
a diode structure comprising a forward current flow direction, the diode structure comprising:
a first semiconductor region of a first conductivity type, the first semiconductor region adjoining the first metallization, the first semiconductor region being electrically coupled with the first metallization and comprising a first doping concentration;
a second semiconductor region of a second conductivity type comprising a second doping concentration and forming a first pn-junction with the first semiconductor region, the first pn-junction being forwardly biased when a forward current flows through the diode structure;
at least a third semiconductor region of the first conductivity type electrically coupled with the first metallization and comprising a third doping concentration which is higher than the first doping concentration, the first semiconductor region and the third semiconductor region forming an interface; and
at least a fourth semiconductor region of the second conductivity type at least partially embedded in the third semiconductor region such that at least one of the first semiconductor region and the third semiconductor region is arranged between the second semiconductor region and the fourth semiconductor region,
wherein the fourth semiconductor region comprises a fourth doping concentration which is higher than the second doping concentration, and
wherein the fourth semiconductor region forms a second pn-junction with the third semiconductor region, the fourth semiconductor region being arranged to inject charge carriers at least into the third semiconductor region during at least one of commutation and switching off of the forward current.

2. The bipolar semiconductor device of claim 1, comprising wherein the fourth semiconductor region is coupled to the first metallization.

3. The bipolar semiconductor device of claim 1, comprising wherein the fourth semiconductor region is completely surrounded by the third semiconductor region.

4. The bipolar semiconductor device of claim 1, comprising wherein the second semiconductor region and the third semiconductor region form a third pn-junction.

5. The bipolar semiconductor device of claim 1, comprising wherein, in a vertical cross-section, two spaced apart fourth semiconductor regions adjoin a common third semiconductor region.

6. The bipolar semiconductor device of claim 1, further comprising:
a fifth semiconductor region of the second conductivity type; and
a second metallization, the fifth semiconductor region adjoining the second semiconductor region and the second metallization,
wherein the fifth semiconductor region comprises a fifth doping concentration which is higher than the second doping concentration.

7. The bipolar semiconductor device of claim 1, further comprising:
a fifth semiconductor region of the second conductivity type; and
a sixth semiconductor region of the first conductivity type, the sixth semiconductor region forming a further pn-junction with the second semiconductor region and a separate pn-junction with the fifth semiconductor region, and an insulated gate electrode arranged next to a channel forming region of the sixth semiconductor region.

8. The semiconductor device of claim 1, comprising wherein the line integrated doping concentration along a shortest connection line between the first pn-junction and the second pn-junction is larger than the specific breakdown charge per unit area.

9. A bipolar semiconductor device, comprising
a first metal electrode; and
a speed diode structure, comprising:
a first weakly doped semiconductor region electrically coupled with and adjoining the first metal electrode, the first weakly doped semiconductor region being of a first conductivity type;
a plurality of first heavily doped semiconductor islands of the first conductivity type electrically coupled with the first metal electrode and extending into the first weakly doped semiconductor region;
a second weakly doped semiconductor region of a second conductivity type forming a pn-load junction with the first weakly doped semiconductor region; and
a plurality of second heavily doped semiconductor islands of the second conductivity type arranged between the first metallization and the pn-load junction, each of the plurality of the second heavily doped semiconductor islands being at least partially embedded in, and forming a pn-junction with, one of the first heavily doped semiconductor islands.

10. The bipolar semiconductor device of claim 9, further comprising:
a second metal electrode; and
a heavily doped semiconductor region of the second conductivity type in Ohmic contact with the second metal electrode and arranged between the second metal electrode and the second weakly doped semiconductor region.

11. The bipolar semiconductor device of claim 10, comprising wherein the pn-load junction is forwardly biased when a forward current flows through the bipolar semiconductor device,
wherein the second heavily doped semiconductor islands are coupled to the first electrode, and
wherein, during at least one of commutation and switching off of the forward current, a charge carrier current is injected from the second heavily doped semiconductor islands at least into the first heavily doped semiconductor islands when the maximum voltage drop between the second heavily doped semiconductor islands and the first heavily doped semiconductor islands exceeds the built-in voltage of the semiconductor material.

12. The bipolar semiconductor device of claim 9, comprising wherein each of the second heavily doped semiconductor islands is completely surrounded by a respective first heavily doped semiconductor island.

13. A semiconductor device, comprising:
a first metallization;
a first semiconductor region of a first conductivity type, the first semiconductor region being coupled with and adjoining the first metallization;
a second semiconductor region of a second conductivity type spaced apart from the first metallization, the first semiconductor region and the second semiconductor region forming a first pn-junction;

at least a third semiconductor region of the first conductivity type coupled with the first metallization, the first semiconductor region and the third semiconductor region forming an interface; and at least a fourth semiconductor region of the second conductivity type completely enclosed by the third semiconductor region, the third semiconductor region and the forth semiconductor region forming a second pn-junction.

14. The semiconductor device of claim 13, comprising wherein the semiconductor device is selected from a group consisting of a diode, a thyristor and an IGBT.

15. A bipolar semiconductor device comprising:

a metallization; and a diode structure including a structured emitter coupled to the metallization, the structured emitter including a first weakly doped semiconductor region of a first conductivity type that forms a pn load junction with a weakly doped second semiconductor region, and at least a highly doped first semiconductor island of the first conductivity type which at least partially surrounds a highly doped second semiconductor island of the second conductivity type, wherein the first weakly doped semiconductor region adjoins the metallization.

* * * * *